United States Patent [19]
Venkatesan et al.

[11] Patent Number: 5,145,713
[45] Date of Patent: Sep. 8, 1992

[54] STOICHIOMETRIC GROWTH OF COMPOUNDS WITH VOLATILE COMPONENTS

[75] Inventors: Thirumalai Venkatesan, Washington, D.C.; Sukru Yilmaz, Atlantic Highlands, N.J.

[73] Assignees: Bell Communications Research, Inc., Livingston, N.J.; Heinrich-Hertz-Institut, Berlin, Fed. Rep. of Germany

[21] Appl. No.: 633,407

[22] Filed: Dec. 21, 1990

[51] Int. Cl.⁵ .................... B05D 3/06; C23C 14/00
[52] U.S. Cl. .................... 427/53.1; 427/42; 427/62; 505/1; 505/731; 505/732; 505/816; 505/819; 204/192.15; 204/192.24
[58] Field of Search .................... 427/53.1, 42, 62, 38, 427/39, 35; 204/192.1, 192.12, 192.15, 192.24, 192.26; 505/731, 732, 816, 819, 1

[56] References Cited

U.S. PATENT DOCUMENTS

| | | | |
|---|---|---|---|
| 4,920,094 | 4/1990 | Nogawa et al. | 505/731 |
| 4,968,665 | 11/1990 | Ohuchi et al. | 505/731 |
| 5,015,492 | 5/1991 | Venkatesan et al. | 427/53.1 |
| 5,017,277 | 5/1991 | Yoshida et al. | 427/53.1 |
| 5,019,552 | 5/1991 | Balooch et al. | 505/732 |
| 5,032,571 | 7/1991 | Takemura | 505/732 |
| 5,047,385 | 9/1991 | Beasley et al. | 505/731 |
| 5,049,405 | 9/1991 | Cheung | 427/53.1 |

FOREIGN PATENT DOCUMENTS

| | | | |
|---|---|---|---|
| 2060864 | 3/1987 | Japan | 505/731 |
| 1072423 | 3/1989 | Japan | 505/732 |
| 1076619 | 3/1989 | Japan | 505/731 |
| 1100827 | 4/1989 | Japan | 505/732 |
| 1126207 | 5/1989 | Japan | 505/732 |
| 1159372 | 6/1989 | Japan | 505/731 |
| 2092808 | 3/1990 | Japan | 505/731 |
| 2092809 | 3/1990 | Japan | 505/731 |
| 2192403 | 7/1990 | Japan | 505/731 |
| 3016920 | 1/1991 | Japan | 505/731 |

OTHER PUBLICATIONS

Sreenivas et al, "Metal Targets", J. Appl. Phys, 64 (3) Aug. 1988 pp. 1484–1493.
Shaw et al, ". . . Supercond. films on Si at 400° C.", Phy. Appl. Lett., 54 (6) Feb., 1989 pp. 578–580.
Wu et al, "Superlattices of Y—Ba—Cu—O/$Y_y$—PR-$_{1-y}$—BaCuO grown by pulsed laser deposition", Appl. Phys. Lett., 56 (4) Jan. 1990 pp. 400–402.
Goteau et al, "Growth & Characterization of $Pb(Zr_1Ti)O_3$ Films deposited by Reactive sputtering of Metallic targets", IEEE, (no month) 1986 pp. 606–609.
Kanai et al, "Low temperature formation of multilayered Bi(Pb)—Sr—Ca—Cu—O Thin Films by successive deposition using laser ablation", Appl. Phys. Lett., 54 (18) May. 1989 pp. 1802–1804.

(List Continued on next page.)

*Primary Examiner*—Marianne Padgett
*Attorney, Agent, or Firm*—Leonard Charles Suchyta; Charles S. Guenzer

[57] ABSTRACT

A method of growing $KTa_xNb_{1-x}O_3$ by pulsed laser evaporation. In order to compensate for the volatile K, two targets are prepared, one of sintered oxide powder having K, Ta, and Nb in amounts stoichiometric to $KTa_xNb_{1-x}O_3$ and the other of melt-grown $KNO_3$. The method can also be used to form other complex materials having volatile components using a variety of sputtering growth techniques. The two targets are mounted on a rotating target holder and are alternately ablated by the laser beam. The $KNO_3$ provides excess K, thus allowing the growth of a stoichiometric film. The method can be applied to many complex materials for which some of the components are volatile.

23 Claims, 2 Drawing Sheets

OTHER PUBLICATIONS

Kageyama et al, "Effect of declination angle of substrate position on Magnetron sputter diaphragm YBa$_2$Cu$_3$O$_{7-}$target", Appl. Phys. Lett, 55 (10) Sep. 1989 pp. 1035–1037.

Mashburn et al, "Dep. of High T$_c$ supercond. Thin films by Pulsed Laser Ablation", Brodsky et al, High—T Superconductors, Symposium Nov./Dec. 1987 pp. 699–702.

Tachikawa et al "High—T$_c$ Supercond. films of Y—Ba—Cu oxide prep. by CO$_2$ laser Beam Evap.", Mat. Res. Soc. Symp. Proc. vol. 97, Nov./Dec. 1987, pp. 723–726.

Lynds et al, "Supercond. Thin films of (RE)Ba$_2$Cu$_3$(Ag)O$_{7-x}$ prep by Pulsed Laser Ablation", Mat. Res. Soc. Symp. Proc., vol. 99, Nov./Dec. 1987, pp. 707–710.

G. M. Davis et al, "Epitaxial growth of thin films of BaTiO$_3$ using excimer laser ablation," *Applied Physics Letters*, Jul., 1989, vol. 55, pp. 112–114.

T. Venkatesan et al, "Substrate effects on the properties of Y—Ba—Cu—O superconducting films prepared by laser deposition," *Journal of Applied Physics*, May, 1988, vol. 63, pp. 4591–4590.

E. W. Chase et al, "Multilayer High T$_c$ thin film structures fabricated by pulsed laser deposition of Y—Ba—Cu—O," *Journal of Material Research*, Nov./Dec., 1989, vol. 4, pp. 1326–1329.

E. Wu et al. "Ferroelectric ceramics—The Sol-Gel method versus conventional processing," *Material Research Society Symposium Proceedings*, 1984 vol. 32, pp. 169–173.

STOICHIOMETRIC GROWTH OF COMPOUNDS WITH VOLATILE COMPONENTS

FIELD OF THE INVENTION

The invention relates generally to growth of materials. In particular, it relates to the growth of materials having volatile components by the use of pulsed-energy deposition or other sputtering methods.

BACKGROUND ART

Potassium tantalate niobate ($KTa_xNb_{1-x}O_3$ or KTN) is a compatible solid solution of the two perovskites, potassium tantalate ($KTaO_3$) and potassium niobate ($KNbO_3$). It exhibits several attractive properties: quadratic electro-optic behavior (Kerr effect), linear electro-optic behavior (Pockels effect), a high dielectric permittivity, and large piezo-electric and pyro-electric coefficients. Its constituent crystals have almost identical unit-cell sizes in the cubic phase (0.3989 nm and 0.4021 nm, respectively), but vastly different Curie temperatures 4° K. and 698° K., respectively). Thus, variation of the alloying percentage x will control the phase-transition temperatures of the KTN alloy and thus its main properties at a given temperature.

Bulk KTN crystals usually exhibit striations and composition inhomogeneities, which prevent their widespread use in electro-optic devices.

Several groups have reported the growth of epitaxial ferro-electric thin films. In particular, Davis et al. have disclosed the growth of $BaTiO_3$ using laser ablation in "Epitaxial growth of thin films of $BaTiO_3$ using excimer laser ablation," Applied Physics Letters, volume 55, 1989, pages 112-114. This technique has been intensively developed for the growth of superconducting thin films of $YBa_2Cu_3O_{7-x}$, which also has a perovskite crystal structure. In this technique, a compressed powder target is prepared having stoichiometric amounts of the non-oxygen components. An ultra-violet laser pulse then irradiates this target in an oxygen ambient at a slow repetition rate, e.g., 10 Hz. The very high energy densities cause a non-equilibrium evaporation of the target material, some of which is deposited onto the substrate on which the film is being grown. Some details have been disclosed by Venkatesan et al. in U.S. Pat. No. 5,015,492 and U.S. patent application, Ser. No. 07/505,013, filed Apr. 4, 1990 and by Venkatesan et al. in "Substrate effects on the properties of Y—Ba—Cu—O superconducting films prepared by laser deposition", Journal of Applied Physics, Volume 63, 1988, pages 4591-4598.

We have attempted to use the pulsed laser technique to grow thin films of $KTa_{0.55}Nb_{0.45}O_3$. First, we prepared a stoichiometric target. In the resulting laser-grown films, the proper Ta to Nb ratio was obtained, but the films were observed to be potassium deficient, i.e., $K_yTa_{0.55}Nb_{0.45}O_3$, where y was between 0.5 and 0.7. It is well known that the pulsed-energy deposition of high-$T_c$ superconductive materials other than $YBa_2Cu_3O_{7-x}$ may require that the target contain non-stoichiometric amounts of the components. It is thought that the extra amount compensates for a volatile component, here the potassium. We then prepared targets with excess potassium in the amounts of 25-100% provided by powder of $KNO_3$ (KNO) mixed with the KTN powder and then sintered at a high temperature. This compensated growth provided good epitaxial growth of the right composition. However, the constituent KNO and KTN powders reacted differently to the pulsed laser radiation. As a result, the target surface became roughened, and large particles were ejected from the target and deposited on the film substrate. The resulting films displayed poor optical quality. In addition, these inhomogeneous targets became chemically and physically unstable over time.

SUMMARY OF THE INVENTION

Accordingly, an object of the invention is to grow epitaxial thin films of materials having a volatile component, such as potassium tantalum niobate.

Another object of the invention is to grow such films by laser ablation.

A specific object of the invention is to grow high-quality potassium tantalum niobate thin films.

The invention can be summarized as a method of growing thin films by pulsed energy deposition. Multiple targets are prepared, one containing the volatile component in a stable form. Excess volatile component is contained in the two targets. For example, a stoichiometric KTN target and a $KNO_3$ target containing the volatile K are prepared. The two targets are then separately irradiated with pulsed radiant energy. The two targets may be semicircular and mounted on a common rotating support so that a single laser beam alternately irradiates both targets.

DETAILED DESCRIPTION OF THE PREFERRED EMBODIMENTS

Figure 1:
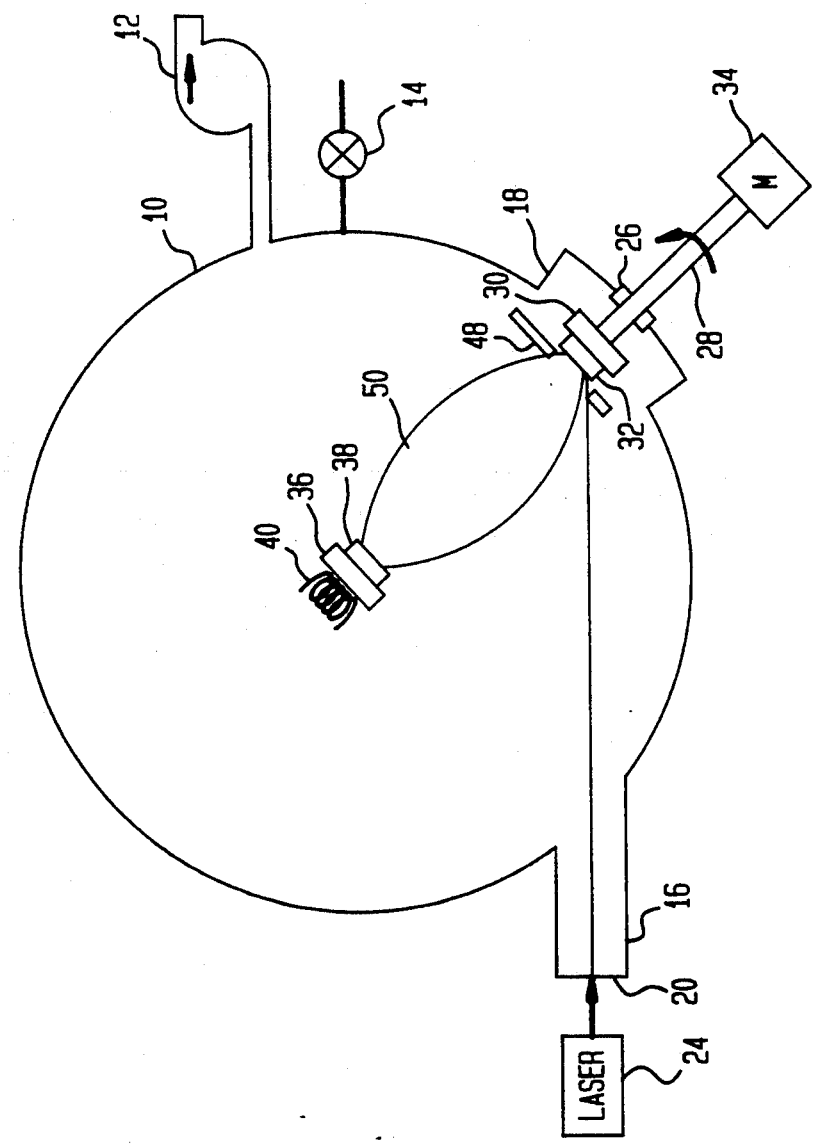
FIG. 1 is a pictorial illustration of a laser ablation system usable with the invention.

The pulsed-laser deposition apparatus used in demonstrating an embodiment of the invention closely follows that disclosed in the above cited U.S. patent application, Ser. No. 07/505,013 and is illustrated pictorially in FIG. 1. A vacuum chamber 10 is pumped to moderately low pressures by a vacuum pump 12. Oxygen is leaked into the chamber 10 through a valve 14 so as to keep the oxygen pressure within the chamber in the vicinity of 1 millitorr to 1 torr. Two ports 16 and 18 arranged at 135° around the chamber 10. The first port 16 contains a window 20 transparent to ultra-violet light. A pulsed UV (ultraviolet) laser 24 is aligned to provide laser light through the first port 16.

The second port 18 is fit with a rotary feedthrough 26 through which a rotatable shaft 28 penetrates through a wall into the chamber 10. On the interior end of the shaft 28 is screwed a target holder 30. A target 32 is fixed to the target holder 30 at a position such that the beam from the laser 24 strikes its principal surface at 45° but at a position offset from the axis of the shaft 28. A motor 34 rotates the shaft 28.

A substrate holder 36 is hung from the top of the chamber 10 at its center and faces the target 32 across a distance of about 7 cm. The substrate holder 36 mounts a substrate 38 onto which the film is to be grown. An electric heater 40 heats the substrate holder 36 and thus the substrate 38.

Figure 2:
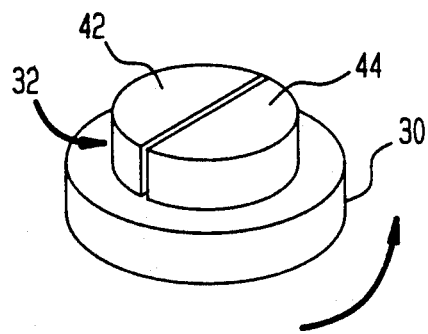
FIG. 2 is a plan view of a segmented target usable with the invention.

In order to overcome the potassium deficiency while avoiding the effect of target roughening, the target 32 is a segmented target 32, as illustrated in plan view in FIG. 2. The first sector 42 is composed of KTN and has a composition of K, Ta, and Nb that is stoichiometric with the desired film. The second sector 44 is composed of $KNO_3$ and provides the extra potassium in a target form which is stable in normal environmental conditions. In particular, it is not hygroscopic and does not flake. That is, it does not absorb nor react with moist, room-temperature air. Other potassium containing stable compounds may be used, e.g., $K_2CO_3$, KCl, $K_2O$, $K_3N$, and KOH.

Both target sectors 42 and 44 are fixed to the rotatable target holder 30. The laser-beam intensity is adjusted and the target 32 is rotated at a rate such that the pulsed laser beam strikes each of the sectors 42 and 44 several times during the growth of a unit-cell thickness of the film 46, as illustrated in cross-section in FIG. 3, growing on the substrate 38. Laser ablation of the KTN target sector 42 provides for the correct ratio between Ta and Nb in the growing KTN film, although K would be deficient if only the KTN target sector 42 were used. Ablation of the KNO film provides excess K adjacent to the growing film. Thereby, stoichiometric KTN is grown.

A rotatable segmented target was disclosed in the above cited U.S. patent application, Ser. No. 07/505,013. In one use, the two target sectors contained different stoichiometric compositions so that a layered heterostructure could be grown by simply rotating the target holder. In a second use, atomic layer epitaxy could be performed if one sector contained only the components for one layer while the other sector contained only the components for a different layer. The sectors would then be interchanged during the growth of each atomic-cell thickness.

EXAMPLE 1

A thin film of $KTa_{0.55}Nb_{0.45}O_3$ was grown using the invention.

The KTN target sector 42 was prepared by mixing powders of potassium carbonate ($K_2CO_3$), tantalum pentoxide ($Ta_2O_5$), and niobium pentoxide ($Nb_2O_5$) in proportions that would provide the stoichiometric amounts of K, Ta, and Nb for $KTa_{0.55}Nb_{0.45}O_3$. The mixed powders were sintered at 1000° C. for 20 hours and then cooled to form a melt-grown crystal. As an alternative preparation method, Wu et al. have suggested a sol-gel processing method disclosed in the *Proceedings of the 6th International Symposium on Applications of Ferroelectrics*, 1986, pages 391–393.

The KNO target sector 44 was prepared by melting $KNO_3$ powder to 334° C. and then cooling it. The resulting melt-grown target 44 was either crystalline or polycrystalline (locally crystalline). Both sectors 42 and 44 were semi-circular with a radius of about 1.2 cm and were glued next to each other on the target holder 30.

Figure 3:
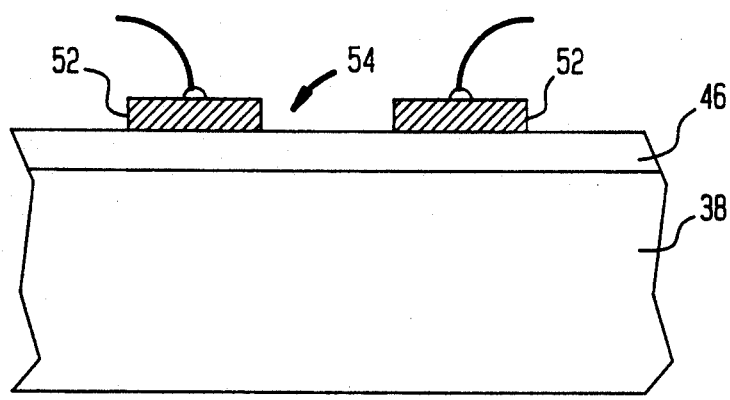
FIG. 3 is a cross-section view of an exemplary film and its substrate grown according to the invention.

Single-crystal strontium titanate ($SrTiO_3$) having a (110) orientation was used as the substrate 38, as illustrated in cross-section in FIG. 3. During deposition, it was held at temperatures of between 700° and 750° C.

The KrF excimer laser 24 having a a UV wavelength of 248 nm produced a $2 \times 5$ nm$^2$ laser spot on the target 32. Pulses of 20 ns duration were repeated at 10 to 15 Hz. Each pulse had an energy density of $\sim 1$ J/cm$^2$. Although the simple target holder of U.S. patent application Ser. No. 07/505,013 could have been used, we instead used the carousel described by Chase et al. in "Multilayer high $T_c$ thin film structures fabricated by pulsed laser deposition of Y—Ba—Cu—O", *Journal of Materials Research*, volume 4, 1989 at pages 1326–1329. The carousel is convenient for growing multi-layer structures. The two sectors 42 and 44 were mounted on one of the three target holders in the carousel and this target holder 30 was rotated at 0.5 Hz. Therefore, the laser 24 pulsed each sector 42 or 44 five to eight consecutive times before moving on to the other sector 44 or 42. This time was much less than that required for growing a unit cell of KTN. The chamber 10 was maintained at an partial oxygen pressure of between 50 and 100 mtorr.

Markedly different plasma formation was observed for the two sectors. A brilliant whitish plume developed from the surface of the KTN sector 42, but ray-like jets were ejected from the surface of the KNO sector 44. The growth rate of a KTN film 46 illustrated in FIG. 3 was estimated to be $\sim 12$ nm/min.

Following completion of deposition, the samples were cooled down to room temperature while the oxygen pressure was maintained.

The fabricated film was tested by Rutherford backscattering. When the ions irradiated the film at an angle offset from the normal, the backscattering data was fit to a simulation of a film having a composition of $K_1Ta_{0.67}Nb_{0.33}O_3$. That is, the fabricated film had a composition relatively close to the alloying percentage $x=0.7$ of the target and there was no potassium deficiency. When the ion beam was aligned with the surface normal, the backscattering dropped dramatically, indicating that the ions were channeling in a highly crystalline film. X-ray diffraction patterns of the film showed only (110) and (220) reflections for the KTN in addition to the corresponding $SrTiO_3$ reflections. Thus, the KTN film was oriented with the (110) substrate. Transmission electron micrographs showed some dislocations, perhaps introduced during sample thinning. Atomic-scale micrographs showed a uniform crystalline KTN film, and the interface between the film and the substrate was marked only by the change in lattice constant (2.5%).

The technique of Example 1 was refined by reducing the pellet ratio to $\frac{3}{4}$KTN:$\frac{1}{4}$KNO$_3$ by the use of 90° and 270° sectors 40 and 42. Furthermore care was taken to prevent the KNO$_3$ from melting at temperatures above 334° C. by its exposure to the hot substrate holder 36, held at 700°–760° C. A water-cooled copper shield 48 was placed in front of the segmented target 32 with an aperture for the laser beam and a plume 50 irradiating the substrate 38. Thereby, we were able to perform depositions extending over times longer than 90 minutes, which is needed to prepare thick ($>1$ μm) films of KTN.

EXAMPLE 2

We prepared one film of $KTa_{0.55}Nb_{0.45}O_3$ using the above refinements. Deposition was performed over 70 minutes. Two parallel platinum electrodes 52 were then deposited on the KTN film 46 with a 80 μm gap 54 between the electrodes 52. Light was shone onto the bottom of the $SrTiO_3$ substrate, and the light emitted from the KTN film 46 was observed through a polarizing microscope. It was observed that the light intensity in the gap 54 increased as the voltage was increased across the electrodes 52. This relatively rough experiment nonetheless demonstrated that the KTN films grown by our process are indeed electro-optically active.

EXAMPLES 3 AND 4

The composition of the above examples $KTa_{0.55}Nb_{0.45}O_3$ was chosen because an alloying percentage $x=55\%$ provides the maximum electro-optical effect. The invention addresses the volatility of K and not the alloying percentage x. Two more examples demonstrate the applicability of the inventive method to all values of the alloying percentage x. A film of $KTaO_3$ ($x=1$) was prepared with two targets of respectively stoichiometric sintered KTa oxide powder and melt-grown $KNO_3$. Another film of $KTa_{0.65}Nb_{0.35}O_3$ ($x=65\%$) with two targets of respectively stoichiometric sintered $KTa_{0.65}Nb_{0.35}$ oxide powder and the $KNO_3$. Pulsed laser deposition was used for both films. In both cases, the films were of good quality and of the expected stoichiometry.

The laser deposition method appears to be an excellent method for preparing thin films of complex, unusual materials. For example, we have attempted to grow thin films of $SrRuO_3$, $SrPbO_3$, and $CdSnO_3$ as possible electrode materials. However, we have experienced problems if the target material contains elemental components with high vapor pressure in their elemental or oxide phases. For $SrRuO_3$ films, $Ru_2O_5$ was one of the target powders. Initial attempts produced ruthenium deficient films ($Ru \approx 0.6$) because of the high volatility of ruthenium oxide. Similar difficulties were experienced in attempting to deposit $SrPbO_3$ film. The lead was always deficient and required compensating. Similarly, attempts with $CdSnO_3$ initially produced films with deficient cadmium. The method of the present invention can be used to grow these films with volatile components. One of the targets would contain stoichiometric amounts of the metals SrRu, SrPb, or CdSn, sintered in their oxide forms. The other target would contain the volatile metal in oxide form, viz., $Ru_2O_5$, $PbO_3$, or $CdO_2$. For $SrRuO_3$, it was found that the $Ru_2O_5$ powder could be added as an excess amount to the stoichiometric SrRu oxide to form a single target.

The invention can be advantageously applied to the Bi and Tl superconductors which have proved difficult to fabricate because of volatile components. In the Bi-based superconductors, $Bi_2Sr_2Ca_{n-1}Cu_nO_x$, where $n=1$, 2, or 3, Bi is the volatile component. For their growth by the invention, the volatile target contains the Bi in thermodynamically stable form, e.g., BiO or $BiNO_3$, while the non-volatile pellet contains the remaining components in thermodynamically stable form, e.g., $Sr_2Ca_{n-1}Cu_nO_x$. The related Tl-based superconductors $Tl_2Ba_2Ca_{n-1}Cu_nO_x$, where $n=1$, 2, or 3, suffer from the volatility of Tl. For their growth, the volatile target may contain, for example, TlO or $TlNO_3$, and the non-volatile target may contain $Ba_2Ca_{n-1}Cu_nO_x$. For both these classes of superconductors, the non-volatile target need not contain the volatile component.

Popular electro-optic materials in addition to the KTN of the examples are $LiNbO_3$ and $LiTaO_3$, both of which suffer from volatile Li. In growing these materials according to the invention, the volatile target may be, for example, LiO or $LiNO_3$, and the non-volatile target may be $Nb_2O_3$ and $Ta_2O_3$ respectively.

The ferro-electric materials PLZT (lead lanthanum zirconia titania) and PMN (lead magnesium niobate) suffer from volatile lead. For these materials, $PbO_3$ may be used for the volatile target.

The invention is not limited to pulsed laser deposition. By the use of two or more thermodynamically stable targets, surface depletion of volatile components is prevented by other forms of sputter deposition, including DC and RF magnetron sputtering, in which all targets are simultaneously and continuously sputtered.

The invention allows for the stoichiometric growth of complex materials that may lack the thermodynamic stability found in simpler materials. The stoichiometric growth is achieved by only minor modifications of standard processing techniques, specifically, the use of multiple multi-elemental targets together representing the desired film composition.

What is claimed is:

1. A method of forming a thin film of a composition having components of different volatility, comprising the steps of:
   providing a first target having a first composition containing stoichiometric amounts of first and second components that are stoichiometric with respect to a desired uniform composition;
   providing a second target having a second composition of a multi-species compound containing a third component of said desired composition, wherein said third component is more volatile than said first and second components and wherein all components excluding oxygen contained in said desired composition are contained in said first and second targets;
   a first step of irradiating said first target with a type of energy to evaporate said first composition and cause at least a portion of said first composition to form a first portion of said thin film on a substrate adjacent to said first target; and
   a second step of irradiating said second target with said type of energy to evaporate said second composition and cause at least a portion of said second composition to form a second portion of said thin film on said substrate.

2. A method as recited in claim 1, wherein each of said first and second steps irradiates a respective one of said targets with a plurality of pulses of energy during a growth of an atomic unit cell of said thin film having said desired composition.

3. A method as recited in claim 2, wherein said first and second steps irradiates said first and second targets with pulsed laser energy.

4. A method as recited in claim 3, further comprising the steps of:
   mounting said first and second targets on a rotatable target holder; and
   rotating said target holder so that said targets alternately enter a beam path of a pulsed laser, whereby said first and second irradiating steps are alternately performed.

5. A method as recited in claim 1, wherein said first and second irradiating steps are simultaneously performed.

6. A method as recited in claim 1, wherein said second target contains said second composition in a crystalline or polycrystalline form.

7. A method as recited in claim 1, wherein said second composition does not substantially react at room temperature with humid air.

8. A method as recited in claim 1, wherein said first and second compositions are both thermodynamically stable.

9. A method as recited in claim 1, wherein said desired composition has a perovskite crystal structure.

10. A method as recited in claim 9, wherein said desired composition comprises $KTa_xNb_{1-x}O_3$, $0 \leq x \leq 1$.

11. A method as recited in claim 10, wherein said first and second steps irradiates said first and second targets with pulsed laser energy.

12. A method as recited in claim 9, wherein said desired composition comprises $SrRuO_3$ and said second composition comprises $Ru_2O_5$.

13. A method as recited in claim 9, wherein said desired composition comprises $SrPbO_3$ and said second composition comprises $PbO_3$.

14. A method as recited in claim 9, wherein said desired composition comprises $Bi_2Sr_2Ca_{n-1}Cu_nO_x$, wherein n is an integer in the range from 1 to 3, wherein said first composition comprises $Sr_2Ca_{n-1}Cu_n$, and wherein said second composition comprises a material chosen from the group consisting of BiO and $BiNO_3$.

15. A method as recited in claim 9, wherein said desired composition comprises $Tl_2Ba_2Ca_{n-1}cu_{n-1}$, whrein n is an integer in the range from 1 to 3, wherein said first composition comprises $Ba_2Ca_{n-1}Cu_n$, and wherein said second composition comprises a material chosen from the group consisting of TlO and $TlNO_3$.

16. A method as recited in claim 9, wherein said desired composition comprises $LiNbO_3$, wherein said first composition comprises $Nb_2O_3$, and wherein said second composition comprises and material selected from the group consisting of LiO and $LiNO_3$.

17. A method as recited in claim 9, wherein said desired composition comprises $LiTaO_3$, wherein said first composition comprises $Ta_2O_3$, and wherein said second composition comprises a material chosen from the group consisting of LiO and $LiNO_3$.

18. A method as recited in claim 9, wherein said desired composition is chosen from the group consisting of lead lanthanum zirconia titania and lead magnesium niobate, and wherein said second composition comprises $PbO_3$.

19. A method of forming a thin film of a composition having components of different volatility, comprising the steps of:

providing a first target having a first composition containing stoichiometic amounts of first, second, and third components that are stoichiometric with respect to a desired composition, wherein said first composition and said desired composition are substantially the same except for respective oxygen components;

providing a second target having a second composition of a multi-species compound containing said third component of said desired composition;

a first step of irradiating said first target with energy to evaporate said first composition and cause at least a portion of said first composition to form a first portion of said thin film on a substrate adjacent to said first target; and a second step of irradiating said secod target with energy to evaporate said second composition and cause at least a portion of said second composition to form a second portion of said thin film on said substrate.

20. A method of growing a film containing potassium, comprising the steps of:

providing a first target comprising $KTa_xNb_{1-x}$, wherein $0 \leq x \leq 1$;

providing a second target of a stable compound comprising K but not $KTa_xNb_{1-x}$;

placing said first and second targets adjacent a substrate; and irradiating said first and second targets with energy so as to evaporate said $KTa_xNb_{1-x}$ [$KTa_xNb_{1-x}O_3$] and said stable compound and to form a film on said substrate substantially comprising $KTa_xNb_{1-x}O_3$.

21. A method as recited in claim 20, wherein said stable compound comprises a material selected from the group consisting of $KNO_3$, $K_2CO_3$, $K_2O$, $K_3N$, and KOH.

22. A method as recited in claim 21, wherein said second target is homogeneous and at least locally crystalline.

23. A method as recited in claim 22, wherein said energy is pulsed laser energy.

* * * * *

UNITED STATES PATENT AND TRADEMARK OFFICE
CERTIFICATE OF CORRECTION

PATENT NO. : 5,145,713

DATED : September 8, 1992

INVENTOR(S) : Thirumalai Venkatesan and Sukru Yilmaz

It is certified that error appears in the above-identified patent and that said Letters Patent is hereby corrected as shown below:

Column 4, line 59, "80" should read --20--.
Column 7, line 20, "$Tl_2Ba_2Ca_{n-1}Cu_{n-1}$," should read --$Tl_2Ba_2Ca_{n-1}Cu_{n-1}$,--;
line 21, "whrein" should read --wherein--;
line 28, "and" should read --a--.
Column 8, line 16, "secod" should read --second--;
line 31, delete "$[KTa_xNb_{1-x}O_3]$".

Signed and Sealed this

Seventh Day of June, 1994

BRUCE LEHMAN

*Attest:*

*Attesting Officer*     *Commissioner of Patents and Trademarks*